(12) United States Patent
Zhu et al.

(10) Patent No.: US 8,284,380 B2
(45) Date of Patent: Oct. 9, 2012

(54) DUAL-STAGE SWITCHING SYSTEM FOR LITHOGRAPHIC MACHINE

(75) Inventors: Yu Zhu, Beijing (CN); Ming Zhang, Beijing (CN); Jinsong Wang, Beijing (CN); Guang Li, Beijing (CN); Dengfeng Xu, Beijing (CN); Wensheng Yin, Beijing (CN); Guanghong Duan, Beijing (CN); Kaiming Yang, Beijing (CN)

(73) Assignee: Tsinghua University, Beijing (CN)

( * ) Notice: Subject to any disclaimer, the term of this patent is extended or adjusted under 35 U.S.C. 154(b) by 461 days.

(21) Appl. No.: 12/669,671

(22) PCT Filed: Mar. 14, 2008

(86) PCT No.: PCT/CN2008/000502
§ 371 (c)(1),
(2), (4) Date: Jan. 19, 2010

(87) PCT Pub. No.: WO2009/009947
PCT Pub. Date: Jan. 22, 2009

(65) Prior Publication Data
US 2010/0208227 A1      Aug. 19, 2010

(30) Foreign Application Priority Data

Jul. 19, 2007  (CN) .......................... 2007 1 0119275

(51) Int. Cl.
*G03B 27/42*  (2006.01)
*G03B 27/58*  (2006.01)
*H02K 41/02*  (2006.01)

(52) U.S. Cl. ..................... 355/72; 310/12.05; 310/12.06; 355/53

(58) Field of Classification Search ................ 310/12.01, 310/12.05–12.06, 12.13; 318/649; 355/53, 355/72, 75, 77
See application file for complete search history.

(56) References Cited

U.S. PATENT DOCUMENTS 5,996,437 A    12/1999  Novak et al.
6,262,796 B1   7/2001   Loopstra et al.
(Continued)

FOREIGN PATENT DOCUMENTS

CN            1485694         3/2004
(Continued)

OTHER PUBLICATIONS

International Search Report dated Jun. 26, 2008.

*Primary Examiner* — Hung Henry Nguyen
*Assistant Examiner* — Colin Kreutzer
(74) *Attorney, Agent, or Firm* — RatnerPrestia

(57) ABSTRACT

A dual-stage switching system for lithographic machine includes a wafer stage to be operated in an exposure station and another wafer stage to be operated in a pre-processing station. The two wafer stages are provided on a base, with four 2-DOF driving units capable of moving along X direction and Y direction being provided along the edge of the base, and the wafer stages being disposed in a space surrounded by the four 2-DOF driving units and suspended on an upper surface of the base by air bearings. Each of the 2-DOF driving units includes upper and lower linear guides and a guiding sleeve, with the upper and lower linear guides being installed vertical to each other in their corresponding guiding sleeve. Two adjacent 2-DOF driving units cooperatively drive the wafer stage) to move in the X direction and Y direction.

5 Claims, 5 Drawing Sheets

U.S. PATENT DOCUMENTS

2002/0196421 A1  12/2002  Tanada et al.
2008/0151200 A1* 6/2008  Takaiwa .................. 355/30

FOREIGN PATENT DOCUMENTS

| | | |
|---|---:|---|
| CN | 1485694 A | 3/2004 |
| CN | 1828427 A | 9/2006 |
| CN | 1924712 A | 3/2007 |
| CN | 101101454 A | 1/2008 |
| EP | 0729073 | 8/1996 |
| JP | 200538874 | 2/2005 |
| JP | 2005285881 | 10/2005 |
| WO | WO 9840791 | 9/1998 |

* cited by examiner

DUAL-STAGE SWITCHING SYSTEM FOR LITHOGRAPHIC MACHINE

This application claims priority of PCT International Application No. PCT/CN2008/000502 filed on Mar. 14, 2008. The contents of which are incorporated herein by reference.

TECHNICAL FIELD

The invention relates to a dual-stage switching system for a lithographic machine, especially for a semiconductor lithographic machine. The invention is applicable in semiconductor manufacture equipment field.

BACKGROUND ART

In the manufacturing of an integrated circuit chip, one of the most important steps comprises exposing and transferring the designed pattern for the chip onto the photoresist which covers a surface of a silicon wafer. This step is also referred to as "photolithography" in which a machine called lithographic machine (or exposure machine) is used. The characteristic line width (or resolution) and the production efficiency of the integrated circuit chip are greatly affected by the resolution and exposure efficiency of the lithographic machine. The resolution and the exposure efficiency of the lithographic machine, in turn, are mainly depended on the movement precision and the working efficiency of an ultra-precise wafer moving and positioning system (which will be referred to as "wafer stage" below) which is a key system in the lithographic machine.

The basic principle of a step scan and projection lithographic machine is shown in FIG. 1. A deep ultra violet beam emitted from a light source 45 passes through a mask plate 47 and a lens system 49, so that a portion of the pattern on the mask plate is imaged onto a chip of a wafer 50. Then, the mask plate and the wafer perform synchronized movements in opposite directions at a certain speed ratio. In this way, all the patterns on the mask plate are imaged onto certain chips of the wafer.

A basic function of a wafer stage moving and positioning system is to carry a wafer during exposure and apply a movement with predetermined speed and direction to achieve precise transferring of the patterns on the mask plate to various areas of the wafer. Considering that the line width of the chip is very small (now a minimum line width of 45 nm can be obtained), to ensure a high alignment precision and resolution, the wafer stage must have an extremely high moving and positioning precision. In addition, the production efficiency of a lithographic process is significantly affected by the moving speed of the wafer stage. Thus, there is a continuous need that the moving speed of the wafer stage should be increased for improving production efficiency.

As to traditional wafer stages, such as those disclosed in EP 0 729 073 and U.S. Pat. No. 5,996,437, a lithographic machine generally has only one wafer moving and positioning unit, i.e., only one wafer stage, on which some preparation steps such as leveling, aligning and focusing are carried out. Among these steps which are all time consuming, the aligning step, which is performed by low speed scanning (with a typical alignment scanning speed of 1 mm/s) with extremely high precision, requires a very long working time. Shortening the working times for the preparation is very difficult. In this condition, for improving the production efficiency of the lithographic machine, the moving speed during stepping and exposure scanning of the wafer stage must be increased. However, increasing in moving speed inevitably results in deterioration of the dynamic properties of the system. For this reason, a lot of techniques are focused on ensuring and increasing the movement precision of wafer stages. Thus, the cost for maintaining current movement precision or obtaining even higher movement precision is significantly high.

WO 98/40791 (publication date: Sep. 17, 1998; the Netherlands) discloses a system having a dual stage structure, in which some exposure preparation steps, such as loading and unloading of the chips, pre-alignment, alignment, and the like, are performed on a second wafer stage which is simultaneously moved with a main exposure stage. Since a large amount of preparation operations for chip exposure are performed by the second wafer stage, the working time of each wafer on the exposure stage can be significantly shortened and the production efficiency can be increased correspondingly, even if the moving speed of the wafer stage is not increased. However, a main problem existed in this system is caused by its off-center driving manner (driving line being offset from the weight center of the wafer stage).

The same applicant of the present application filed an application in 2003, titled by "Ultra-Precise Wafer Positioning System for Step Projection Lithographic Machine with Dual-Stage Alternated Exposure" (application number: CN 03156436.4), in which a dual stage switching mechanism having linear guides on opposite sides is disclosed. This dual stage system does not have any spatially overlapped components, and thus no collision preventing means is needed. However, it has been found that there are still several problems in this dual stage system. First, the system requires an extremely high interfacing precision. Second, only the spaces on one side of the linear guides are used simultaneously, resulting in a bulky outer profile of the stage system, which is unwanted for the semiconductor chip manufacturers which have strict requirements to equipment space usage. Third, a bridging device with a drive is needed for switching the wafer stages of this system, which increases the complexity of the system.

SUMMARY OF THE INVENTION

An object of the invention is to address the problems existed in the prior art by providing a dual-stage switching system for lithographic machine, by means of which, the disadvantages found in the prior art, such as off-center driving, having a complex structure, requiring extremely high guide interfacing precision, and the like, can be overcome. The system of the invention may have a simple structure and a high space usage and does not need any supplementary interfacing means. In addition, the exposure efficiency of the lithographic machine can be improved.

The above object will be achieved by a dual-stage switching system for lithographic machine, the system comprising a first wafer stage to be operated in an exposure station and a second wafer stage to be operated in a pre-processing station, with the two wafer stages being arranged on a base, wherein four 2-DOF driving units are provided near the edges of the base respectively and are movable in X direction and Y direction individually, the two wafer stages are arranged within a space surrounded by the four 2-DOF driving units and are suspended above an upper surface of the base via air bearings; each of the 2-DOF driving units comprises an upper linear guide, a lower linear guide and a guiding sleeve, with the upper linear guide and the lower linear guide mounted to the guiding sleeve and being perpendicular to each other; the 2-DOF driving units and the wafer stages are coupled by air bearings which are preloaded by permanent magnets and/or by vacuum; and each wafer stage is moved in X direction or Y direction by the upper linear guide of one of the 2-DOF driving units which applies a pushing or pulling force to this wafer stage, while the lower linear guide of a neighboring 2-DOF driving unit performs synchronized following movement with that upper linear guide at the same speed and in the same direction.

In a preferred embodiment of the invention, each of the upper and lower linear guides is provided with a linear motor and air bearings. The four 2-DOF driving units may be located in recess along the edges of the base.

In a preferred embodiment of the invention, the upper and lower linear guides are provided with linear gratings for providing position feedbacks of the 2-DOF driving units.

In a preferred embodiment of the invention, the system further comprises a dual-frequency laser interferometer for providing movement and position feedbacks of the wafer stages.

The invention provides significant advantages with respect to the prior art. First, in the system of the invention, the 2-DOF driving units and the wafer stages are coupled by air bearings which are preloaded by permanent magnets and/or by vacuum. Thus, the disadvantages found in the prior art, such as off-center driving, having a complex structure, requiring extremely high guide interfacing precision, and the like, can be overcome, and the structure of the system can by greatly simplified.

Further, the dual-stage switching of the system is achieved by four 2-DOF driving units which have the same structure, which results in lowering down the complexity of the system.

LIST OF PARTS SHOWN IN THE DRAWINGS

1—base
2—upper surface of the base
5—recess
6—exposure station
7—pre-processing station
10—wafer stage to be operated in the exposure station
12—wafer stage to be operated in the pre-processing station
21—first 2-DOF driving unit
22—second 2-DOF driving unit
23—third 2-DOF driving unit
24—fourth 2-DOF driving unit
30—lower linear guide
30a—stator of a lower linear motor
30b—mover of the lower linear motor
35—guiding sleeve
40—upper linear guide
40a—stator of an upper linear motor
40b—mover of the upper linear motor
45—light source
47—mask plate
49—lens system
50—wafer
60a—lateral close-formed preloaded air bearing for a lower linear guide
60b—vertical air bearing preloaded by permanent magnets for the lower linear guide
61a—lateral close-formed preloaded air bearing for an upper linear guide
61b—vertical air bearing preloaded by permanent magnets for the upper linear guide
80—air bearing preloaded by permanent magnets and/or by vacuum
100a—linear grating of an upper linear guide
100b—linear grating of a lower linear guide
110—reflecting mirror with long optical path
111—45 degree deflecting mirror
112—upper reflecting mirror
115—dual-frequency laser interferometer

DETAILED DESCRIPTION OF PREFERRED EMBODIMENTS

Figure 1:
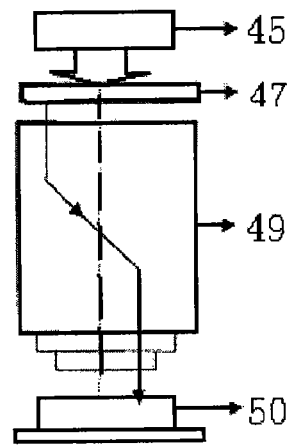
FIG. 1 shows a working manner of a lithographic machine.
Figure 2:
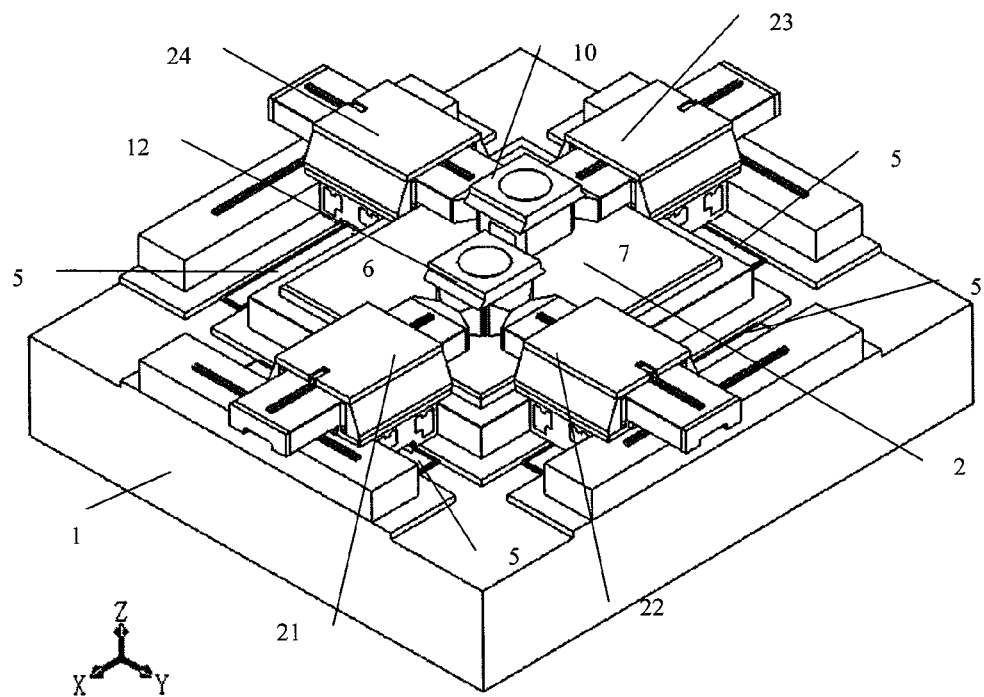
FIG. 2 shows a dual-stage switching system for a lithographic machine according to the invention, in a state before stage switching.

FIG. 2 shows a schematic view of a dual-stage switching system for lithographic machine according to an embodiment of the invention. The system comprises a base 1, a first wafer stage 10 to be operated in an exposure station 6, a second wafer stage 12 to be operated in a pre-processing station 7, and four 2-DOF (degree of freedom) driving units arranged on the edges of the base and movable in X direction and Y direction. The two wafer stages are arranged within a space surrounded by the four 2-DOF driving units and are suspended above the upper surface of the base by air bearings. Each of the 2-DOF driving units comprises an upper linear guide 40, a lower linear guide 30 and a guiding sleeve 35, with the upper linear guide and the lower linear guide mounted to the guiding sleeve and being perpendicular to each other. The 2-DOF driving units are coupled with the wafer stages via air bearings 80 preloaded by permanent magnets and/or by vacuum.

Figure 3:
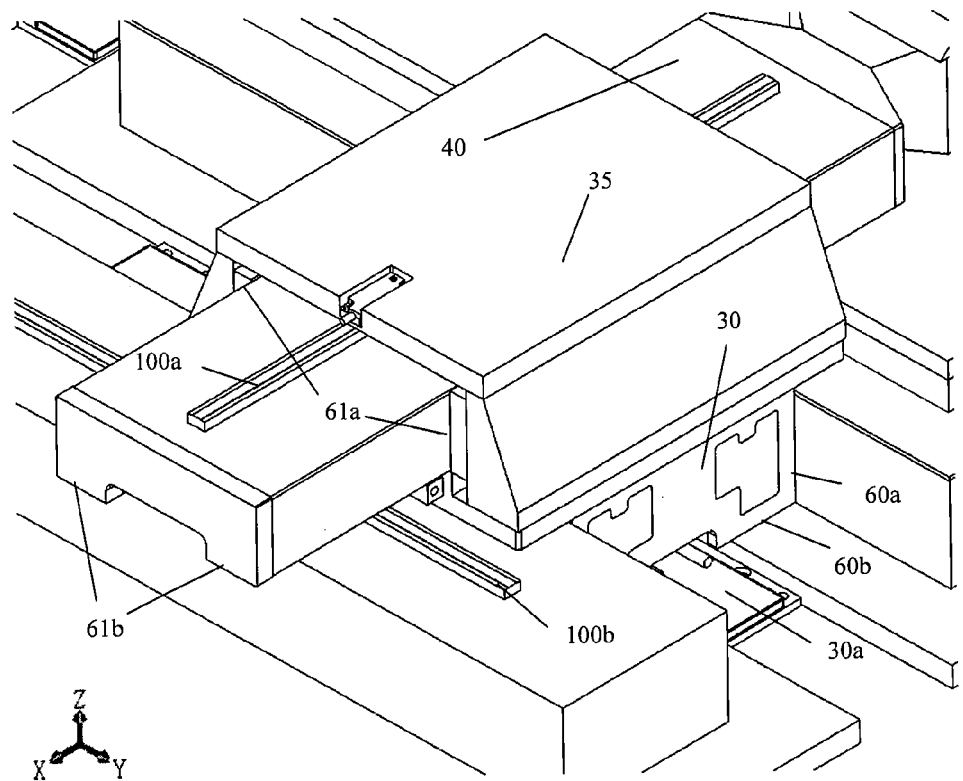
FIG. 3 shows the structure of 2-DOF driving units of the invention.
Figure 4:
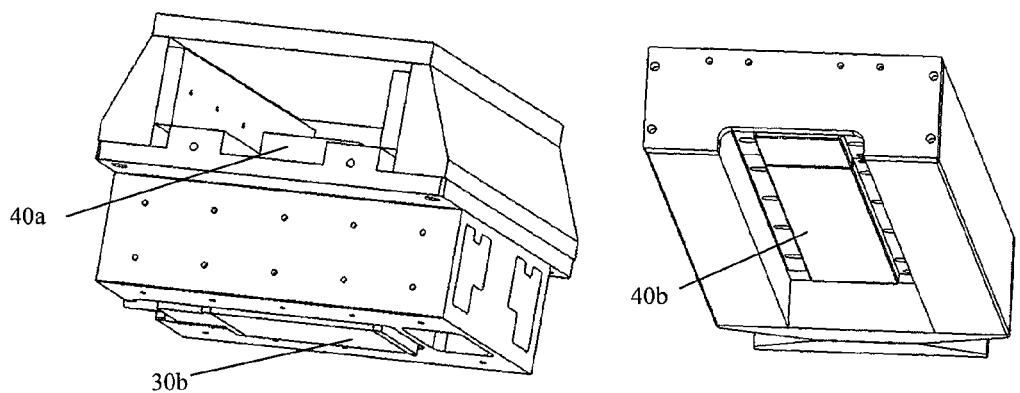
FIG. 4 shows the structures of a guiding sleeve and an upper linear guide.

FIGS. 3 and 4 show the structure of one of the 2-DOF driving units and the arrangement of its air bearings. The upper linear guide 40 is provided on its upper surface with a linear grating 100a, and the lower linear guide 30 is also provided with a linear grating 100b. Position feedbacks of the 2-DOF driving unit can be obtained by means of the linear gratings. The upper linear guide and the lower linear guide each comprise a linear motor and air bearings, with the linear motor being composed of a permanent-magnet set and a coil. The coil of the linear motor of the upper linear guide 40 functions as an upper linear-motor stator 40a which is mounted in the guiding sleeve 35, while the corresponding permanent-magnet set functions as a linear-motor mover 40b which is mounted in the upper linear guide and drives the wafer stage to move. The permanent-magnet set of the linear motor of the lower linear guide 30 functions as a linear-motor stator 30a which is mounted in a recess 5 of the base, while the corresponding coil functions as linear-motor mover 30b which is mounted in the guiding sleeve 35.

FIG. 3 further shows the arranging positions of the air bearings of the 2-DOF driving unit. The upper linear guide and the lower linear guide are each provided with air bearings.

The lower linear guide is supported in the recess 5 of the base by lateral close-formed preloaded air bearings 60a for the lower linear guide and vertical air bearings 60b preloaded by permanent magnets for the lower linear guide. Lateral close-formed preloaded air bearings 61a for the upper linear guide and vertical air bearings 61b preloaded by permanent magnets for the upper linear guide are arranged along opposite inner side surfaces and the bottom surface of the guiding sleeve 35, as shown in FIG. 3.

Figure 5:
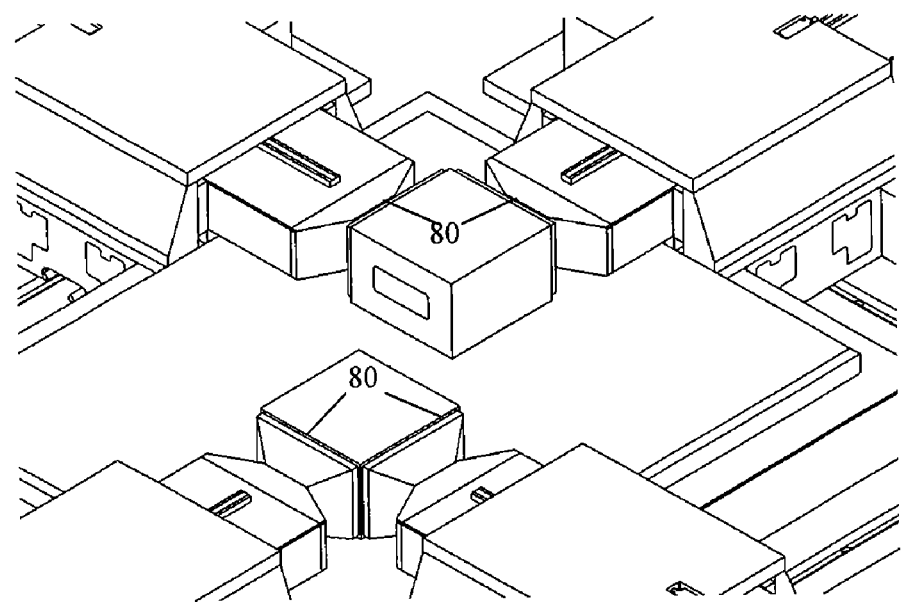
FIG. 5 shows the coupling between the wafer stages and the 2-DOF driving units.

FIG. 5 shows the coupling between the wafer stages and the 2-DOF driving units. Specifically, they are coupled by air bearings 80 which are preloaded by permanent magnets or by vacuum.

As shown in FIGS. 2, 3 and 4, the movement of the wafer stage 12 in X direction is achieved by the pushing or pulling of the upper linear guide 40 of a first 2-DOF driving unit 21. During this movement, a neighboring second 2-DOF driving unit 22 is maintained to be attached to a side of this wafer stage, with its lower linear guide 30 performing synchronized following movement with the upper linear guide 40 of the 2-DOF driving unit 21 at the same speed and in the same direction, and the position of the upper linear guide 40 of the 2-DOF driving unit 22 keeps unchanged. In this way, this wafer stage is driven to move in X direction. The movement of the wafer stage 12 in Y direction movement is achieved by the pushing or pulling of the upper linear guide 40 of the second 2-DOF driving unit 22. During this movement, the lower linear guide 30 of the neighboring first 2-DOF driving unit 21 performs synchronized following movement with the upper linear guide 40 of the 2-DOF driving unit 22 at the same speed and in the same direction, while the position of the upper linear guide 40 of the 2-DOF driving unit 21 keeps unchanged. In this way, this wafer stage is driven to move in Y direction. Another set of third and fourth 2-DOF driving units 23 and 24 drive the wafer stage 10 to move in the same way as described above.

A dual-stage switching operation performed by the system to the wafer stages is shown in FIGS. 2 and 6-8. Before the wafer stages 10 and 12 are switched, the wafer stages are located at their original positions as shown in FIG. 2, where the wafer stage 12 has undergone exposure movement in the exposure station 6 under the pushing or pulling action of the upper linear guides of the first 2-DOF driving unit 21 and the second 2-DOF driving unit 22 via corresponding air bearings 80, while the wafer stage 10 has undergone pre-processing movement in the pre-processing station 7 under the pushing or pulling action of the upper linear guides of the third 2-DOF driving unit 23 and the fourth 2-DOF driving unit 24 via corresponding air bearings 80.

Figure 6:
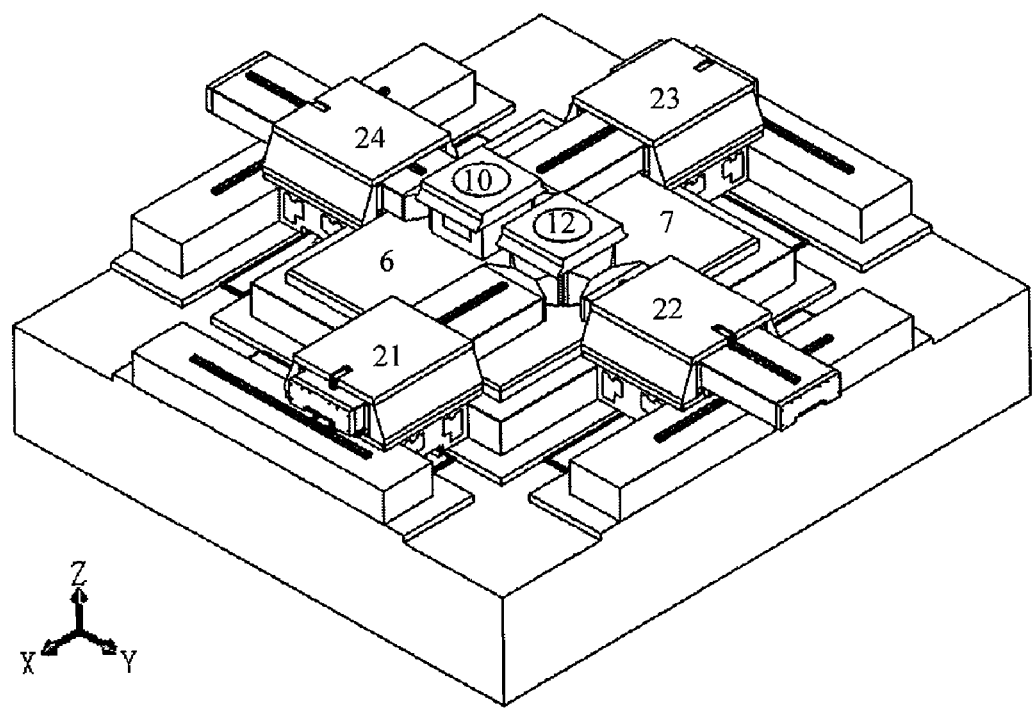
FIG. 6 shows the state of the two wafer stages which have been moved to a switching position before switching.
Figure 7:
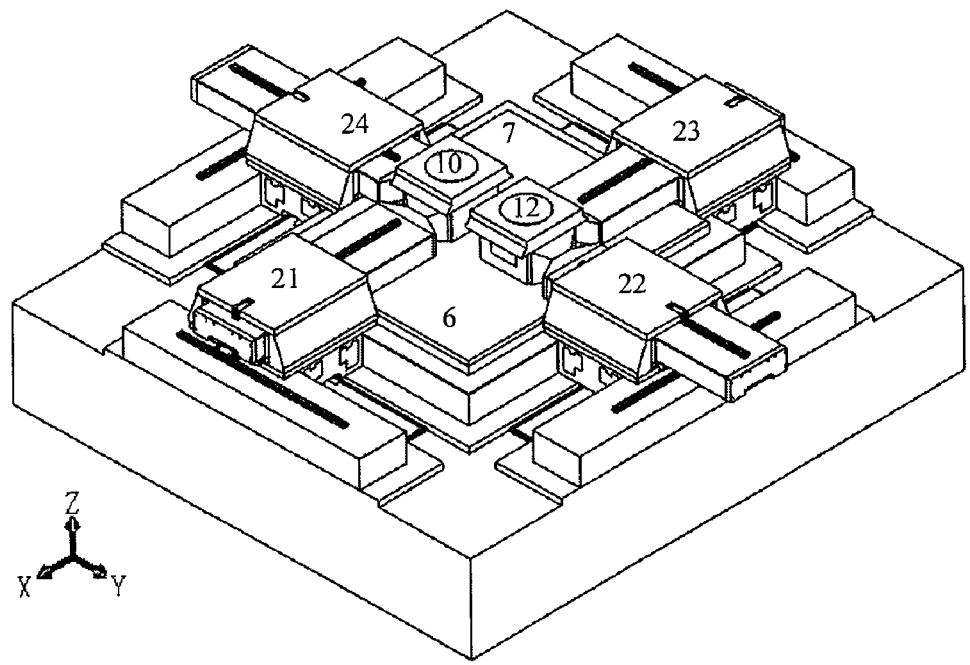
FIG. 7 shows the state of the two wafer stages at the switching position after switching.
Figure 8:
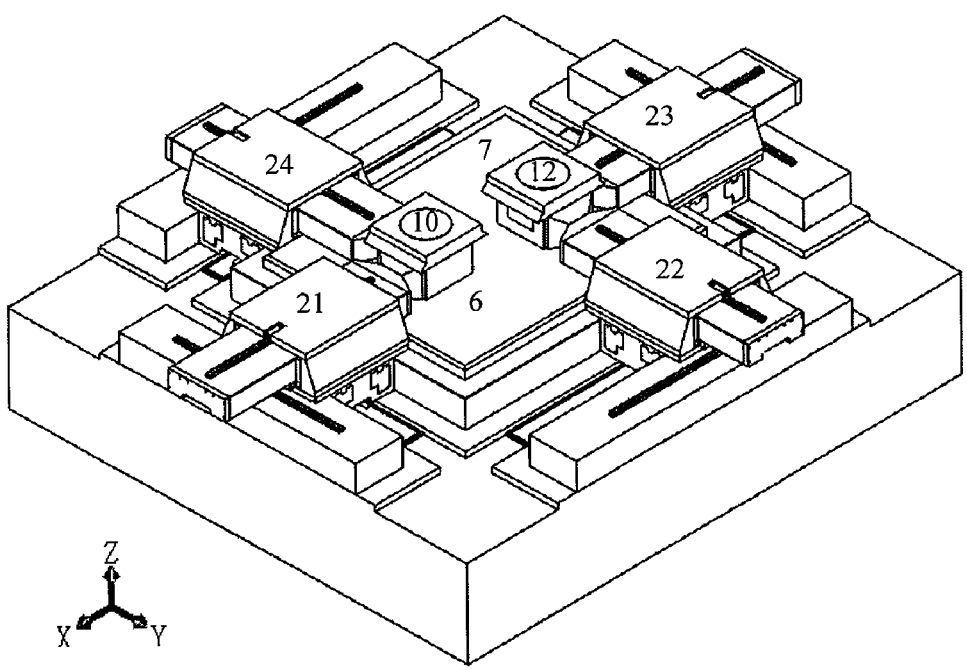
FIG. 8 shows the system after the switching is completed.

After the wafer stages have completed the pre-processing step and the exposure step respectively, the system enters into a dual-stage switching state as shown in FIGS. 6-8. First, the first 2-DOF driving unit 21 is moved by means of its lower linear guide 30 to the side of the wafer stage 10 which is to be moved to the exposure station, and the third 2-DOF driving unit 23 is moved by means of its lower linear guide 30 to the side of the wafer stage 12 which is to be moved to the pre-processing station. Then, the wafer stage 10 is driven by the 2-DOF driving units 21 and 24 instead of by the 2-DOF driving units 23 and 24 so as to be moved to the exposure station from the pre-processing station where it was located before switching, and the wafer stage 12 is driven by the 2-DOF driving units 22 and 23 instead of by the 2-DOF driving units 21 and 22 so as to be moved to the pre-processing station from the exposure station where it was located before switching. After that, the dual-stage switch operation is completed and a new working cycle will be started. FIG. 6 shows the positions of the first 2-DOF driving unit 21 and the third 2-DOF driving unit 23 before moving along the edges of the base, and FIG. 7 shows the positions of the first 2-DOF driving unit 21 and the third 2-DOF driving unit 23 after moving along the edges of the base.

Figure 9:
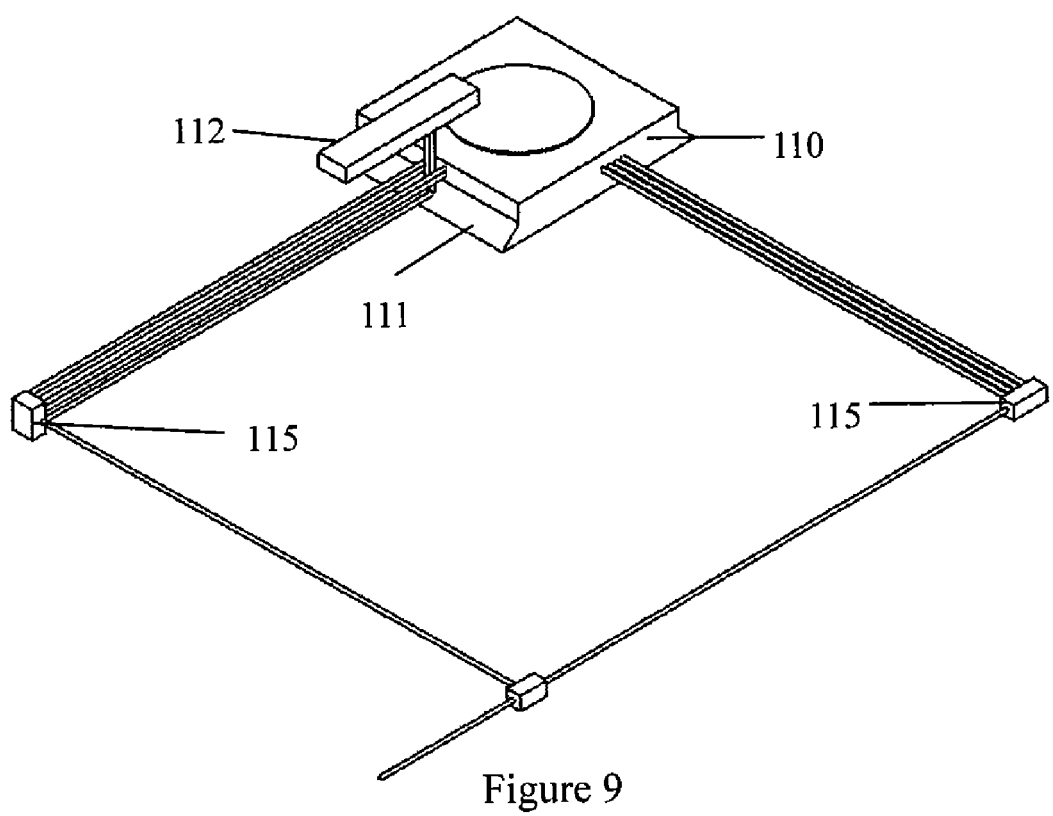
FIG. 9 shows a measuring scheme for the wafer stage in which a laser interferometer is used for position feedback.

FIG. 9 shows a spatial arrangement manner of a dual-frequency laser interferometer 115 which is used for position feedback according to the invention. Each of the wafer stages is provided with an L-shaped reflecting mirror 110 having a long optical path. The wafer stage is further provided with a 45-degree deflecting mirror 111 for measuring the micro-displacement of the wafer stage in vertical direction. This measuring system is physically isolated from the wafer stage positioning system described above by means of vibration isolating means, and thus only the spatial arrangement of the dual-frequency laser interferometer is shown in FIG. 9. By means of this measuring scheme, 6-DOF spatial movement and position of each wafer stage can be measured in a high precision, and a full position feedback can be provided.

The invention claimed is:

1. A dual-stage switching system for lithographic machine, the system comprising a first wafer stage to be operated in an exposure station and a second wafer stage to be operated in a pre-processing station, with the two wafer stages being arranged on a base;
    wherein four 2-DOF driving units are provided near the edges of the base respectively and are movable in X direction and Y direction individually, the two wafer stages are arranged within a space surrounded by the four 2-DOF driving units and are suspended above an upper surface of the base via air bearings;
    each of the 2-DOF driving units comprises an upper linear guide, a lower linear guide and a guiding sleeve, with the upper linear guide and the lower linear guide mounted to the guiding sleeve and being perpendicular to each other;
    the 2-DOF driving units and the wafer stages are coupled by air bearings which are preloaded by permanent magnets and/or by vacuum; and
    each wafer stage is moved in X direction or Y direction by the upper linear guide of one of the 2-DOF driving units which applies a pushing or pulling force to this wafer stage, while the lower linear guide of a neighboring 2-DOF driving unit performs synchronized following movement with that upper linear guide at the same speed and in the same direction.

2. The dual-stage switching system for lithographic machine according to claim 1, wherein each of the upper and lower linear guides is provided with a linear motor and air bearings;
    the linear motor of the upper linear guides comprises a coil which functions as an upper linear-motor stator and is mounted in the guiding sleeve and a permanent-magnet set which functions as a linear-motor mover and is mounted in the upper linear guide for driving the wafer stage to move; and
    the linear motor of the lower linear guide comprises a permanent-magnet set which functions as a linear-motor stator and is mounted in a recess of the base and a corresponding coil which functions as a linear-motor mover and is mounted in the guiding sleeve.

3. The dual-stage switching system for lithographic machine according to claim 1, wherein the four 2-DOF driving units are located in recesses formed along the edges of the base.

4. The dual-stage switching system for lithographic machine according to claim 3, wherein the upper and lower linear guides are provided with linear gratings for providing position feedbacks of the 2-DOF driving units.

5. The dual-stage switching system for lithographic machine according to claim 1, further comprising a dual-frequency laser interferometer for providing movement and position feedbacks of the wafer stages.

* * * * *